United States Patent
Yoo et al.

(10) Patent No.: US 7,393,213 B2
(45) Date of Patent: Jul. 1, 2008

(54) METHOD FOR MATERIAL GROWTH OF GAN-BASED NITRIDE LAYER

(75) Inventors: Tae Kyung Yoo, Kyunggi-Do (KR); Eun Hyun Park, Kyunggi-Do (KR)

(73) Assignee: Epivalley Co., Ltd., Koomi (KR)

( * ) Notice: Subject to any disclaimer, the term of this patent is extended or adjusted under 35 U.S.C. 154(b) by 0 days.

(21) Appl. No.: 11/569,280

(22) PCT Filed: May 19, 2005

(86) PCT No.: PCT/KR2005/001472

§ 371 (c)(1),
(2), (4) Date: Feb. 21, 2007

(87) PCT Pub. No.: WO2005/112078

PCT Pub. Date: Nov. 24, 2005

(65) Prior Publication Data

US 2007/0184567 A1  Aug. 9, 2007

(30) Foreign Application Priority Data

May 19, 2004  (KR) ............... 10-2004-0035610
Jun. 22, 2004  (KR) ............... 10-2004-0046349

(51) Int. Cl.
*H01L 21/00* (2006.01)
(52) U.S. Cl. ............... 439/22; 438/48; 438/50; 438/E33.005; 438/E33.028
(58) Field of Classification Search .......... 438/22, 438/48–50; 257/86
See application file for complete search history.

(56) References Cited

U.S. PATENT DOCUMENTS

| 5,290,393 | A |   | 3/1994 | Nakamura |
|-----------|---|---|--------|----------|
| 5,810,925 | A |   | 9/1998 | Tadatomo et al. |
| 5,935,705 | A | * | 8/1999 | Chen et al. ............ 428/367 |
| 6,090,358 | A | * | 7/2000 | Chen et al. ............ 423/324 |
| 6,508,878 | B2 |  | 1/2003 | Kim et al. |
| 6,537,513 | B1 |  | 3/2003 | Amano et al. |
| 2004/0074437 | A1 | * | 4/2004 | Fang et al. ............... 117/2 |

FOREIGN PATENT DOCUMENTS

| JP | 62-119196 | 5/1987 |
| JP | 4-297023 | 10/1992 |
| KR | 1020040063073 | 7/2004 |
| KR | 1020050014345-0 | 2/2005 |

OTHER PUBLICATIONS

*Applied Physics Letter*, vol. 72, No. 19, pp. 2463-2465 (1998).
*Physical Review B*, vol. 55, No. 9, pp. 5684-5688 (1997).
Jin-Hyo Boo et al., "Growth of hexagonal GaN thin films on Si(111) with cubic SiC buffer layers," *Journal of Crystal Growth*, vol. 189, No. 190, pp. 183-188 (1998).

* cited by examiner

Primary Examiner—Dung A. Le
(74) Attorney, Agent, or Firm—Darby & Darby P.C.

(57) ABSTRACT

The present invention relates to a method for forming a GaN-based nitride layer comprising a first step of forming a first layer comprising $Si_aC_bN_c$ (c,fc>0, a≧0) on a sapphire substrate and a second step for forming a nitride layer comprising a GaN component on the first layer comprising $Si_aC_bN_c$ (c,b>0, a≧O).

13 Claims, 3 Drawing Sheets

FIG. 5

| Material | Lattice Constant (a) |
|---|---|
| Sapphire | 0.2747nm |
| GaN | 0.3189nm |
| SiC | 0.308nm |
| CN | 0.2611nm |
| $Si_{25}C_{39}N_{39}$ | 0.3117nm |

METHOD FOR MATERIAL GROWTH OF GAN-BASED NITRIDE LAYER

TECHNICAL FIELD

The present invention relates to a method for forming a nitride layer based on gallium nitride (GaN) (herein after referred to as "GaN-based nitride layer"), and more particularly, a method for forming a GaN-based nitride layer with high quality using a silicon carbon nitride buffer layer and a wetting layer, which can be suitably used in LED (Light Emitting Diode) and LD (Laser Diode).

BACKGROUND ART

In preparation of semiconductor devices, a substrate comprising sapphire ($Al_2O_3$) or silicon carbide (SiC) is generally used to grow a GaN-based nitride layer. However, these substrates are different from the GaN-based nitride layer in material properties such as lattice constant and thermal expansion coefficient and thus, it is difficult to grow a high quality GaN-based nitride layer. There have been developed and disclosed many techniques for growing the GaN-based nitride layer.

One of the representative methods is using a buffer layer. According to this method, a Al(x)Ga(y)In(z)N film ($0 \leq x \leq 1$, $0 \leq y \leq 1$, $0 \leq z \leq 1$, x+y+z=1) is grown in a single or various composition at 450° C. to 600° C., followed by raising temperature to form the Al(x)Ga(y)In(z)N ($0 \leq x \leq 1$, $0 \leq y \leq 1$, $0 \leq z \leq 1$, x+y+z=1) into a nuclei, which is used as a seed to grow a high quality GaN-based nitride layer. Also, a AlN buffer layer (Japanese Patent publication No. 62-119196), a LT-AlGaN buffer layer (U.S. Pat. No. 5,290,393/Japanese Patent publication No. 4-297023: 1991), a LT(low temperature)-AlGaInN buffer layer (U.S. Pat. No. 6,508,878), a LT-AlInN buffer layer and the like are used. However, when a GaN-based nitride layer is grown by these methods, the grown GaN-based nitride layer has a dislocation density of $10^{10}$ to $10^{12}/cm^2$.

Also, unlike the above-described examples, in which a buffer layer is grown on a sapphire substrate at a low temperature, a GaN-based nitride layer may be directly grown on the substrate at a high temperature. However, there is much room for improvement.

FIG. 1 is a view to explain a method for forming a GaN-based nitride layer on a sapphire substrate according to the prior art, in which a GaN or AlGaN or InGaN buffer layer 11 is grown on a sapphire substrate 10 at a low temperature (typically 500° C. to 800° C.) and a GaN film 12 is grown at a high temperature of about 1050° C. In this case, the GaN or AlGaN or InGaN buffer layer 11 grown at a low temperature is deformed, when the temperature is raised, to have a 3-dimensional shape. The deformed buffer layer 11 serves to buffer strain between the GaN film 12 and the sapphire substrate 10. However, fundamentally, the GaN or AlGaN or InGaN buffer layer 11 also has a big lattice mismatch with the lattice of the sapphire substrate 10 and induces lattice mismatch in the GaN film 12 grown thereon (lattice dislocation density: $10^{10}$ to $10^{12}/cm^2$).

Therefore, in order to reduce such lattice mismatch and improve properties of a thin film to be grown, it is preferable to use a substrate having a lattice corresponding to that of GaN, instead of the sapphire substrate which has been commonly used. However, it is matter-of-fact impossible.

A group where the present inventors also belong to has found that when a buffer layer of a SiC thin film, instead of Al(x)Ga(y)In(z)N ($0 \leq x \leq 1$, $0 \leq y \leq 1$, $0 \leq z \leq 1$, x+y+z=1), which has been disclosed, is formed on a sapphire substrate and a GaN-based nitride layer is formed thereon, the formed GaN-based nitride layer has excellent properties and filed an application based on this discovery (Korean Patent Application Nos. 10-2003-52936 and 10-2003-85334).

Disclosure

[Technical Problem]

In order to solve the problems of the prior art and improve properties of a GaN-based nitride layer to be grown, it is an object to provide a method for forming a SiCN buffer layer on a sapphire substrate and forming a GaN-based nitride layer thereon. According to the present invention, the SiCN layer can alleviate strong strain caused by lattice mismatch between the sapphire substrate and the GaN-based nitride layer sapphire substrate to significantly improve the quality of the GaN film. Particularly, since the composition of $Si_xC_yN_z$ can be varied, it is possible to readily control the strain between the sapphire substrate and the GaN-based nitride layer.

Therefore, it is another object of the present invention to provide a method for reducing lattice dislocation resulting from lattice mismatch between the sapphire substrate and the GaN-based nitride layer and improving the quality of the thin film by using a SiCN buffer layer.

[Technical Solution]

According to the present invention, there is provided a method for forming a GaN-based nitride layer comprising
a first step of forming a first layer comprising $Si_aC_bN_c$(c, b>0, $a \geq 0$) on a sapphire substrate; and
a second step for forming a nitride layer comprising a GaN component on the first layer comprising $Si_aC_bN_c$(c,b>0, $a \geq 0$).

[Advantageous Effects]

According to the present invention, it is possible to grow a GaN film with excellent properties by forming a SiCN thin film, unlike the conventional film of Al(x)Ga(y)In(z)N ($0 \leq x \leq 1$, $0 \leq y \leq 1$, $0 \leq z \leq 1$, x+y+z=1), as a buffer layer on a sapphire substrate by MOCVD and forming a wetting layer and the GaN film thereon, thereby resulting in an opto-electronic device with highly efficiency and high reliability.

Also, by using a buffer layer according to the present invention, it is possible to realize LED (Light Emitting Diode) and LD (Laser Diode) with lattice mismatch between the sapphire substrate and the GaN-based nitride layer being reduced.

DESCRIPTION OF DRAWINGS

Further objects and advantages of the invention can be more fully understood from the following detailed description taken in conjunction with the accompanying drawings in which:

FIG. 5 is a table describing lattice constant of various substances.

MODE FOR INVENTION

In order to help understanding the construction of the present invention, the background of the present invention is explained.

Generally, a substrate composed of sapphire ($Al_2O_3$) or silicon carbide (SiC) is used to grow a GaN-based nitride layer. Particularly, the sapphire substrate is prevalently used due to its moderate price and excellent mechanical properties. However, since the sapphire substrate has material properties (lattice constant, thermal expansion coefficient, etc.) different from the GaN-based nitride layer, a high quality nitride layer cannot be grown thereon and, consequently, the GaN-based nitride layer has a dislocation density of about $10^{10}$ to $10^{12}/cm^2$.

On the other hand, Korean Patent Application Nos. 10-2003-52936 and 10-2003-85334, which have been filed by the same research group of which member is the present inventor, disclosed a SiC buffer layer having a lattice mismatch with gallium nitride (GaN) of 3.3%, which is considerably small, as compared to the lattice mismatch of 13.8% between sapphire ($Al_2O_3$) and gallium nitride (GaN). Thus, the SiC buffer layer may serve as an excellent buffer layer for growing a GaN-based nitride layer on a sapphire ($Al_2O_3$) substrate.

The present inventors have studied SiCN as a buffer layer to further improve various properties caused by lattice mismatch when a GaN-based material is grown on a sapphire substrate.

Such SiCN layer is known to have various lattice constants according to composition of Si, C and N. Also, it may have a hexagonal lattice configuration like GaN and sapphire (See Applied Physics letter, Volume 72, number 19, 11 May 1998 PP2463-2465, Crystalline silicon carbon nitride; and Physical review B, volume 55, number 9, 1 Mar. 1997, pp 5684-5688, carbon nitride compounds with 1:1 stoichiometry).

Further, SiCN material has excellent hardness and stability comparable to diamond and thus, is used as a coating of a ultra-precision tip. According to the present invention, such SiCN material is grown on a sapphire substrate by MOCVD and a GaN film is grown thereon, whereby it is possible to minimize strain between the sapphire substrate and the GaN-based nitride layer. The principle upon which the present invention using the SiCN buffer layer to modify strain, as compared to the prior art, is based, is as follows.

CN has a lattice constant (a) of about 2.6 nm, SiC has a lattice constant of 0.308 nm, GaN has a lattice constant of 0.3189 nm, and sapphire has a lattice constant of 0.2747 nm. Also, according to a recent report, it has been reported that $Si_{23}C_{38}N_{39}$ has a lattice constant of 0.3117 nm. The term "lattice constant (a)", as used herein, means a distance between two nearest neighboring atoms upon a plane in the hexagonal structure.

Figure 4:
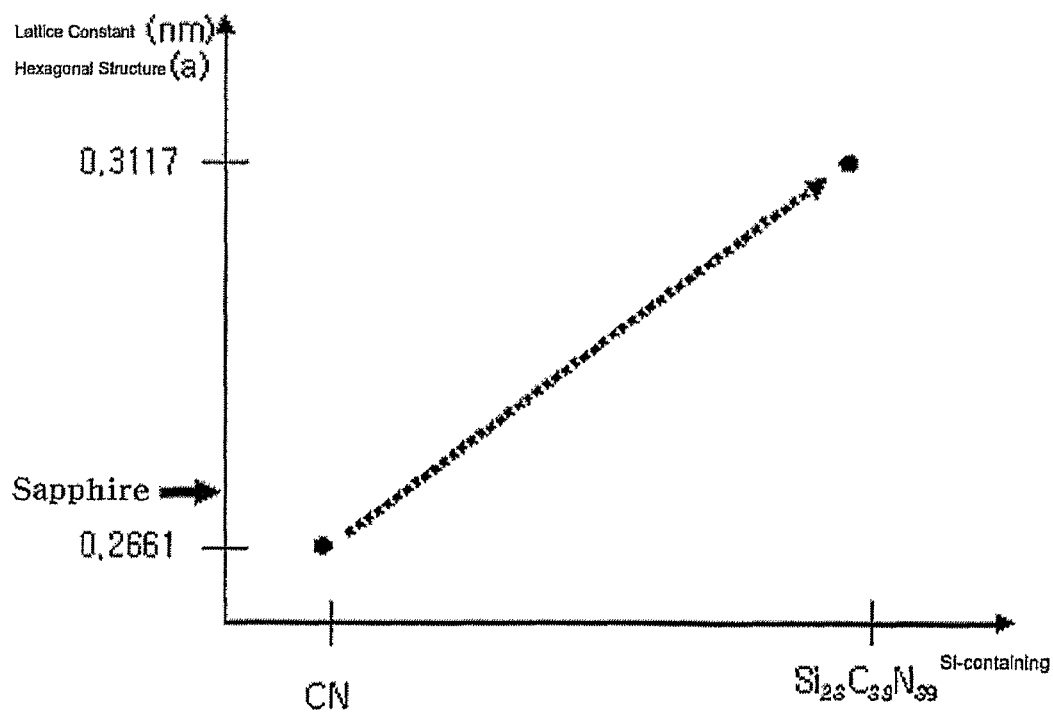
FIG. 4 is a graph showing the change in lattice constant of SiCN according to silicon content.

The properties as described above are briefly summarized in FIG. 4 and FIG. 5. Therefore, the reason why a GaN thin film grown on a sapphire substrate has poor quality is that there is a lattice mismatch of about 17% between the sapphire substrate and the GaN thin film because the sapphire substrate has a lattice constant of 0.2747 nm and GaN has a lattice constant of 0.3189 nm. Due to such a big lattice mismatch, it is very difficult to grow the thin film and there is a limit to obtain a thin film with high quality. Therefore, the present inventors have disclosed a technique for forming a SiC buffer layer described in the applications which were filed before this application, in which SiC has a lattice constant of 0.308 nm which is smaller than that of GaN and thus, has a lattice mismatch with a sapphire substrate of about 13%. As Consequently, the SiC buffer layer can provide better properties than a GaN buffer. However, even when SiC is used, there exists a lattice mismatch of 13%, which may cause problems in forming a high quality thin film.

Thus, in the present invention, a SiCN-based material is introduced as a buffer layer to fundamentally solve the problems related to the lattice mismatch. It has been experimentally found that CN (1:1 stoichiometry) has a lattice constant of 0.2611 nm and $Si_{23}C_{38}N_{39}$ has a lattice constant of 0.3117 nm. By adjusting the SiCN composition, a SiCN layer may be formed to have a lattice dimension corresponding to that of sapphire. Also, a SiCN layer may be formed to have a lattice constant similar to that of GaN (for instant, $Si_{23}C_{38}N_{39}$ has a lattice mismatch with GaN of only 2%). Accordingly, by using SiCN, it is possible to alleviate the lattice mismatch between the sapphire substrate and GaN. As an applied technique, it is possible to form an ideal buffer layer by continuously or discontinuously varying the composition of SiCN to gradually change the lattice constant of SiCN from the lattice dimension of sapphire to the lattice dimension of GaN.

In this case, a buffer layer may be formed so that a SiCN layer in contact with sapphire has substantially the same lattice constant with sapphire and a SiCN layer in contact with GaN has substantially the same lattice constant with GaN.

Also, when a GaN film is grown on the SiCN buffer layer, various properties may be obtained according to growing conditions (SiCN growing temperature, SiCN composition, GaN film growing temperature, III to V atomic ratio, etc.). Particularly, a GaN-based nitride layer, for example, GaN film, is grown at a high temperature, adhesion between SiCN and GaN is deteriorated. As a result, in the initial stage, it is impossible to obtain a uniformly continuous GaN film throughout the entire surface of a wafer, forming a discontinuous GaN film. In order to obtain a continuous GaN film, the GaN film should be grown to a considerable thickness through increasing a horizontal growth mode. According to the present invention, a wetting layer comprising $Al(x1)Ga(y1)In(z1)N$ ($0 \leq x1 \leq 1, 0 \leq y1 \leq 1, 0 \leq z1 \leq 1, x1+y1+z1=1$) is used to improve the adhesion between a SiCN buffer layer and a GaN-based nitride layer to be grown thereon. However, the wetting layer is introduced only to improve properties of the thin film and the wetting layer may be not necessary.

In order to form SiCN used as a buffer layer, silicon, carbon and nitrogen were reacted in a MOCVD system, usable examples of silicon-containing materials include $SiH_4$, $Si_2H_6$, DTBSi and the like, usable examples of carbon-containing materials include $CBr_4$, $CH_4$ and the like and usable examples nitrogen-containing materials include ammonia or hydrazine-based materials.

Meanwhile, in order to grown GaN-based nitride layer, various materials, such as TMIn, TEIn, EDMIn, TMGa, TEGa, TMAl, TEAl $NH_3$, hydrazine and the like, may be used.

As described above, materials for respective thin films according to the present invention are illustrated but the present invention is not limited thereto.

Figure 1:
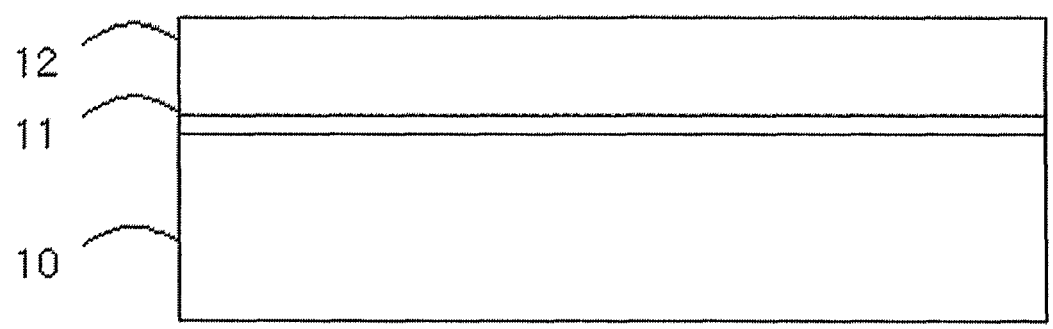
FIG. 1 is a schematic view for explaining the method for forming a GaN-based nitride layer according to the prior art.
Figure 2:
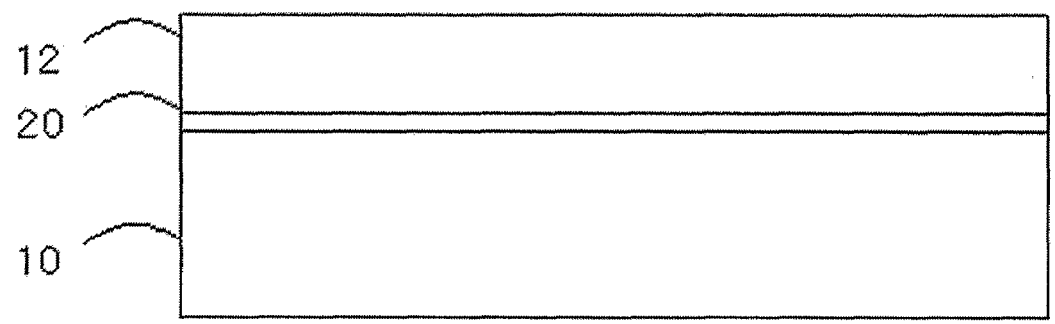
FIG. 2 is a schematic view for explaining the method for forming a SiCN buffer layer on a sapphire substrate and forming GaN film thereon.
Figure 3:
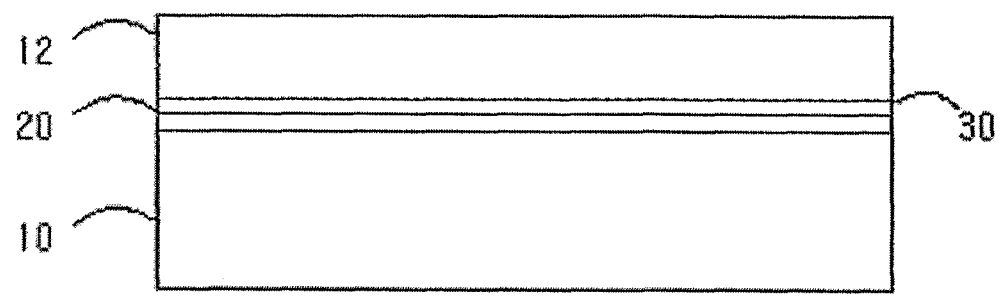
FIG. 3 is a schematic view for explaining the method for forming a SiCN buffer layer on a sapphire substrate and growing a wetting layer and forming GaN film thereon.

Also, the method for forming a GaN-based nitride layer according to the present invention, as shown in FIG. 2 and FIG. 3, comprises the steps of forming a silicon carbon nitride or carbon nitride ($Si_aC_bN_c$, c,b>0, $a \geq 0$) buffer layer (20; hereinafter referred to as "silicon carbon nitride buffer layer") on a sapphire substrate 10 and forming a wetting layer 30 comprising Al(x1)Ga(y1)In(z1)N (0≦x1≦1, 0≦y1≦1, 0≦z1≦1, x1+y1+z1=1) on the silicon carbon nitride buffer layer 20.

The silicon carbon nitride buffer layer 20 is preferably grown between 500° C., at which a layer may be formed, and 1200° C., which is an average acceptable temperature of equipments.

Preferably, the silicon carbon nitride buffer layer 20 has a thickness between 5 Å and 1000 Å. However, in practice, the thickness cannot be precisely provided, since the film is grown in 3-dimension, and it is preferable that an average height is in the foregoing range.

The wetting layer 30 may be formed as a single layer having a same stoichiometric composition or as a multi-layered structure, each layer having different stoichiometric composition.

Preferably, the wetting layer 30 is formed at a temperature between 400° C. and 1100° C. and has a total thickness of 5 Å to 5000 Å.

In the step for forming the wetting layer 30, the V to III ratio is preferably in the range of 1 to 5000, more preferably smaller than the V to III ratio, at which hillock is formed in the GaN-based nitride layer 12.

As described above, the wetting layer 30 may be formed as needed.

The GaN-based nitride layer 12 formed on the wetting layer 30 is preferably grown at a temperature between 900° C. and 1200° C.

Also, the GaN-based nitride layer 12 has preferably a V to III ratio of 500 to 20,000.

Now, the present invention is explained through preferred examples and comparative examples with reference to the attached drawings. In the drawings, the same numerical references have been used to denote the same element and repetitive description is omitted herein.

In the following examples and comparative examples, films are formed by MOCVD, a sapphire substrate 10 is used and a GaN-based nitride layer is grown under the same conditions.

EXAMPLE 1

As shown in FIG. 2, a sapphire substrate 10 was initially pre-baked at a high temperature (1000° C. or higher) and a silicon carbon nitride buffer layer 20 was grown at a temperature between 900° C. and 1000° C. Here, as source materials, DTBSi, $CBr_4$ and $NH_3$ were used and the silicon carbon nitride buffer layer 20 was grown to a thickness of 100 Å. Hydrogen was used as a carrier gas. After completion of the formation of the silicon carbon nitride buffer layer 20, the reactor temperature was raised to 1050° C. and left to stand for stabilization of moisture. Then, a GaN film 12 was grown using TMGa and $NH_3$.

EXAMPLE 2

As shown in FIG. 3, a sapphire substrate 10 was initially pre-baked at a high temperature (1000° C. or higher) and a silicon carbon nitride buffer layer 20 was grown at a temperature between 900° C. and 1000° C. Here, as source materials, DTBSi, $CBr_4$ and $NH_3$ were used and the silicon carbon nitride buffer layer 20 was grown to a thickness of 100 Å. Hydrogen was used as a carrier gas. Then, a wetting layer 30 comprising $In_{0.02}Ga_{0.98}N$ was formed on the silicon carbon nitride buffer layer 20. Here, TMIn, TMGa and $NH_3$ were used as source materials and the growing temperature was 800° C. Also, in the step for forming the wetting layer 30, the V to III atomic ratio (V/III ratio) was set in the range of 5000 to 6000. Then, on the wetting layer 20, a GaN film 12 was formed. Here, the GaN film 12 was grown under the conditions conventionally known to the art and generally was grown at a temperature of about 1050° C.

While the method for growing the GaN-based nitride layer has been described, the present invention is not limited thereto but may be expanded to growth of a nitride layer comprising Al(a)In(b)Ga(c)N (a+b+c=1). Thus, since InN has a lattice constant of 3.544 Å and AlN has a lattice constant of 3.111 Å, the silicon carbon nitride buffer layer according to the present invention can be applied to the growth of the nitride layer comprising Al(a)In(b)Ga(c)N (a+b+c=1).

The invention claimed is:

1. A method for forming a GaN-based nitride layer comprising
   a first step of forming a first layer comprising $Si_aC_bN_c$ (c,b>0, a≧0) on a sapphire substrate; and
   a second step for forming a nitride layer comprising a GaN component on the first layer comprising $Si_aC_bN_c$ (c,b>0, a≧0).

2. The method according to claim 1, which further comprises a step for forming a second layer comprising Al(x1)Ga(y1)In(z1)N (0≦x1≦1, 0≦y1≦1, 0≦z1≦1, x1+y1+z1=1) on the first layer comprising $Si_aC_bN_c$ (c,b>0, a≧0), prior to the second step, in which the nitride layer comprising a GaN component is formed on the second layer.

3. The method according to claim 1, in which the first layer comprising $Si_aC_bN_c$ (c,b>0, a≧0) is grown at a temperature between 500° C. and 1200° C.

4. The method according to claim 1, in which the first layer comprising $Si_aC_bN_c$ (c,b>0, a≧0) has a thickness between 5 Å and 1000 Å.

5. The method according to claim 2, in which the second layer comprising Al(x1)Ga(y1)In(z1)N (0≦x1≦1, 0≦y1≦1, 0≦z1≦1, x1+y1+z1=1) is grown at a temperature between 400° C. and 1100° C.

6. The method according to claim 2, in which the second layer comprising Al(x1)Ga(y1)In(z1)N (0≦x1≦1, 0≦y1≦1, 0≦z1≦1, x1+y1+z1=1) has a thickness between 5 Å and 5000 Å.

7. The method according to claim 1, in which the first layer comprising $Si_aC_bN_c$ (c,b>0, a≧0) has a lattice constant close to that of the sapphire substrate adjacent to the sapphire substrate and a lattice constant close to that of the nitride layer comprising a GaN component adjacent to the nitride layer comprising a GaN component.

8. The method according to claim 2, in which the first layer comprising $Si_aC_bN_c$ (c,b>0, a≧0) has a lattice constant close to that of the sapphire substrate adjacent to the sapphire substrate and has a lattice constant close to that of the second layer comprising Al(x1)Ga(y1)In(z1)N (0≦x1≦1, 0≦y1≦1, 0≦z1≦1, x1+y1+z1=1) adjacent to the second layer comprising Al(x1)Ga(y1)In(z1)N (0≦x1≦1, 0≦y1≦1, 0≦z1≦1, x1+y1+z1=1).

9. The method according to claim 1, in which the first layer comprising $Si_aC_bN_c$ (c,b>0, a≧0) has a lattice constant between a lattice constant of the sapphire substrate and a lattice constant of the nitride layer comprising a GaN component.

10. The method according to claim 2, in which the first layer comprising $Si_aC_bN_c$ (c,b>0, a≧0) has a lattice constant between a lattice constant of the sapphire substrate and a lattice constant of the second layer comprising $Al(x1)Ga(y1)In(z1)N$ ($0 \leq x1 \leq 1$, $0 \leq y1 \leq 1$, $0 \leq z1 \leq 1$, $x1+y1+z1=1$).

11. The method according to claim 9, in which the first layer comprising $Si_aC_bN_c$ ($c,b>0$, $a \geq 0$) has a lattice constant equal to that of the nitride layer comprising GaN component.

12. The method according to claim 10, in which the first layer comprising $Si_aC_bN_c$ ($c,b>0$, $a \geq 0$) has a lattice constant equal to that of the second layer comprising $Al(x1)Ga(y1)In(z1)N$ ($0 \leq x1 \leq 1$, $0 \leq y1 \leq 1$, $0 \leq z1 \leq 1$, $x1+y1+z1=1$).

13. A method for forming a GaN-based nitride layer comprising a first step of forming a first layer comprising $Si_aC_bN_c$ ($c,b>0$, $a \geq 0$) on a sapphire substrate; and a second step for forming a nitride layer comprising $Al(a)In(b)Ga(c)N$ ($a+b+c=1$) on the first layer comprising $Si_aC_bN_c$ ($c,b>0$, $a \geq 0$).

* * * * *